(12) United States Patent
Fullerton et al.

(10) Patent No.: US 9,202,616 B2
(45) Date of Patent: Dec. 1, 2015

(54) INTELLIGENT MAGNETIC SYSTEM

(71) Applicant: Correlated Magnetics Research, LLC, Huntsville, AL (US)

(72) Inventors: Larry W. Fullerton, New Hope, AL (US); Mark D. Roberts, Huntsville, AL (US)

(73) Assignee: Correlated Magnetics Research, LLC, Huntsville, AL (US)

( * ) Notice: Subject to any disclaimer, the term of this patent is extended or adjusted under 35 U.S.C. 154(b) by 36 days.

(21) Appl. No.: 14/103,760

(22) Filed: Dec. 11, 2013

(65) Prior Publication Data

US 2014/0104022 A1    Apr. 17, 2014

Related U.S. Application Data

(63) Continuation-in-part of application No. 13/779,611, filed on Feb. 27, 2013, which is a continuation-in-part of application No. 14/066,426, filed on Oct. 29, 2013, now Pat. No. 8,957,751, which is a continuation of (Continued)

(51) Int. Cl.
*H01F 7/02* (2006.01)
*H01F 7/04* (2006.01)
*G01R 33/038* (2006.01)

(52) U.S. Cl.
CPC .............. *H01F 7/04* (2013.01); *G01R 33/0385* (2013.01); *H01F 7/0257* (2013.01)

(58) Field of Classification Search
CPC ................................. H01F 7/04; H01F 7/0257
USPC .................................................. 335/285–295
See application file for complete search history.

(56) References Cited

U.S. PATENT DOCUMENTS 93,931 A     8/1869   Westcott
361,248 A    4/1887   Winton
(Continued)

FOREIGN PATENT DOCUMENTS

CN    1615573 A      5/2005
DE     354970 C   *  6/1922
(Continued)

OTHER PUBLICATIONS

Atallah et al., 2004, "Design, analysis and realisation of a high-performance magnetic gear", IEE Proc.-Electr. Power Appl., vol. 151, No. 2, Mar. 2004.

(Continued)

*Primary Examiner* — Mohamad Musleh
(74) *Attorney, Agent, or Firm* — Vector IP Law Group; Robert S. Babayi

(57) ABSTRACT

An intelligent magnetic system includes a first piece of ferromagnetic material having magnetically printed field sources having a multi-polarity pattern that extend from a first side to a second side that is magnetically attached to a second piece of ferromagnetic material, where a shunt plate disposed on the first side that routes magnetic flux through the first piece of ferromagnetic material from said first side to said second side. The system also includes at least one simple machine for amplifying an applied force into a detachment force that creates an angled spacing between the first piece of ferromagnetic material and the second piece of ferromagnetic material, at least one sensor for producing sensor data; and a control system for monitoring the sensor data and managing the use of the first piece of ferromagnetic material.

20 Claims, 4 Drawing Sheets

Related U.S. Application Data application No. 13/374,074, filed on Dec. 9, 2011, now Pat. No. 8,576,036, application No. 14/103,760, which is a continuation-in-part of application No. 14/086,924, filed on Nov. 21, 2013, now Pat. No. 8,779,879, which is a continuation-in-part of application No. 14/035,818, filed on Sep. 24, 2013, now Pat. No. 8,872,608, said application No. 14/035,818 is a continuation-in-part of application No. 13/959,649, filed on Aug. 5, 2013, now Pat. No. 8,692,637, which is a continuation-in-part of application No. 13/759,695, filed on Feb. 5, 2013, now Pat. No. 8,502,630, which is a continuation of application No. 13/481,554, filed on May 25, 2012, now Pat. No. 8,368,495, which is a continuation-in-part of application No. 13/351,203, filed on Jan. 16, 2012, now Pat. No. 8,314,671, said application No. 13/351,203 is a continuation of application No. 13/157,975, filed on Jun. 10, 2011, now Pat. No. 8,098,122, which is a continuation of application No. 12/952,391, filed on Nov. 23, 2010, now Pat. No. 7,961,069, which is a continuation of application No. 12/478,911, filed on Jun. 5, 2009, now Pat. No. 7,843,295, and a continuation of application No. 12/478,950, filed on Jun. 5, 2009, now Pat. No. 7,843,296, and a continuation of application No. 12/478,969, filed on Jun. 5, 2009, now Pat. No. 7,843,297, and a continuation of application No. 12/479,013, filed on Jun. 5, 2009, now Pat. No. 7,839,247, said application No. 12/478,911 is a continuation-in-part of application No. 12/476,952, filed on Jun. 2, 2009, now Pat. No. 8,179,219, said application No. 12/478,950 is a continuation-in-part of application No. 12/476,952, said application No. 12/478,969 is a continuation-in-part of application No. 12/476,952, said application No. 12/479,013 is a continuation-in-part of application No. 12/476,952, which is a continuation-in-part of application No. 12/322,561, filed on Feb. 4, 2009, now Pat. No. 8,115,581, which is a continuation-in-part of application No. 12/358,423, filed on Jan. 23, 2009, now Pat. No. 7,868,721, application No. 14/103,760, which is a continuation-in-part of application No. 13/918,921, filed on Jun. 15, 2013, now Pat. No. 8,841,981, which is a continuation of application No. 13/629,879, filed on Sep. 28, 2012, now Pat. No. 8,514,046, which is a continuation of application No. 13/426,909, filed on Mar. 22, 2012, now Pat. No. 8,279,032, and a continuation-in-part of application No. 13/179,759, filed on Jul. 11, 2011, now Pat. No. 8,174,347, application No. 14/103,760, which is a continuation-in-part of application No. 14/045,756, filed on Oct. 3, 2013, now Pat. No. 8,810,348, and a continuation-in-part of application No. 13/240,335, filed on Sep. 22, 2011, now Pat. No. 8,648,681, and a continuation-in-part of application No. 12/476,952, and a continuation-in-part of application No. 12/895,589, filed on Sep. 30, 2010, now Pat. No. 8,760,250, and a continuation-in-part of application No. 12/885,450, filed on Sep. 18, 2010, now Pat. No. 7,982,568, and a continuation-in-part of application No. 12/476,952, filed on Jun. 2, 2009, now Pat. No. 8,179,219, said application No. 14/045,756 is a continuation-in-part of application No. 13/246,584, filed on Sep. 27, 2011, now Pat. No. 8,760,251.

(60) Provisional application No. 61/735,460, filed on Dec. 10, 2012, provisional application No. 61/640,979, filed on May 1, 2012, provisional application No. 61/604,376, filed on Feb. 28, 2012, provisional application No. 61/459,994, filed on Dec. 22, 2010, provisional application No. 61/796,863, filed on Nov. 21, 2012, provisional application No. 61/519,664, filed on May 25, 2011, provisional application No. 61/465,810, filed on Mar. 24, 2011, provisional application No. 61/744,864, filed on Oct. 4, 2012, provisional application No. 61/403,814, filed on Sep. 22, 2010, provisional application No. 61/462,715, filed on Feb. 7, 2011, provisional application No. 61/277,214, filed on Sep. 22, 2009, provisional application No. 61/277,900, filed on Sep. 30, 2009, provisional application No. 61/278,767, filed on Oct. 9, 2009, provisional application No. 61/279,094, filed on Oct. 16, 2009, provisional application No. 61/281,160, filed on Nov. 13, 2009, provisional application No. 61/283,780, filed on Dec. 9, 2009, provisional application No. 61/284,385, filed on Dec. 17, 2009, provisional application No. 61/342,988, filed on Apr. 22, 2010.

(56) References Cited

U.S. PATENT DOCUMENTS

| | | |
|---|---|---|
| 381,968 A | 5/1888 | Tesla |
| 493,858 A | 3/1893 | Edison |
| 675,323 A | 5/1901 | Clark |
| 687,292 A | 11/1901 | Armstrong |
| 996,933 A | 7/1911 | Lindquist |
| 1,081,462 A | 12/1913 | Patton |
| 1,171,351 A | 2/1916 | Neuland |
| 1,236,234 A | 8/1917 | Troje |
| 1,252,289 A | 1/1918 | Murray, Jr. |
| 1,301,135 A | 4/1919 | Karasick |
| 1,312,546 A | 8/1919 | Karasick |
| 1,323,546 A | 8/1919 | Karasick |
| 1,554,236 A | 1/1920 | Simmons |
| 1,343,751 A | 6/1920 | Simmons |
| 1,432,822 A * | 10/1922 | Wood .......................... 294/65.5 |
| 1,624,741 A | 12/1926 | Leppke et al. |
| 1,784,256 A | 12/1930 | Stout |
| 1,895,129 A | 1/1933 | Jones |
| 2,048,161 A | 7/1936 | Klaiber |
| 2,147,482 A | 12/1936 | Butler |
| 2,186,074 A | 1/1940 | Koller |
| 2,240,035 A | 4/1941 | Catherall |
| 2,243,555 A | 5/1941 | Faus |
| 2,269,149 A | 1/1942 | Edgar |
| 2,327,748 A | 8/1943 | Smith |
| 2,337,248 A | 12/1943 | Koller |
| 2,337,249 A | 12/1943 | Koller |
| 2,389,298 A | 11/1945 | Ellis |
| 2,401,887 A | 6/1946 | Sheppard |
| 2,414,653 A | 1/1947 | Iokholder |
| 2,438,231 A | 3/1948 | Schultz |
| 2,471,634 A | 5/1949 | Vennice |
| 2,475,456 A | 7/1949 | Norlander |
| 2,508,305 A | 5/1950 | Teetor |
| 2,513,226 A | 6/1950 | Wylie |
| 2,514,927 A | 7/1950 | Bernhard |
| 2,520,828 A | 8/1950 | Bertschi |
| 2,565,624 A | 8/1951 | phelon |
| 2,570,625 A | 10/1951 | Zimmerman et al. |
| 2,690,349 A | 9/1954 | Teetor |
| 2,694,164 A | 11/1954 | Geppelt |
| 2,964,613 A | 11/1954 | Williams |
| 2,701,158 A | 2/1955 | Schmitt |
| 2,722,617 A | 11/1955 | Cluwen et al. |
| 2,770,759 A | 11/1956 | Ahlgren |
| 2,837,366 A | 6/1958 | Loeb |
| 2,853,331 A | 9/1958 | Teetor |
| 2,888,291 A | 5/1959 | Scott et al. |
| 2,896,991 A | 7/1959 | Martin, Jr. |
| 2,932,545 A | 4/1960 | Foley |

(56) References Cited

U.S. PATENT DOCUMENTS

| | | | |
|---|---|---|---|
| 2,935,352 A | 5/1960 | Heppner | |
| 2,935,353 A | 5/1960 | Loeb | |
| 2,936,437 A | 5/1960 | Fraser et al. | |
| 2,962,318 A | 11/1960 | Teetor | |
| 3,014,751 A * | 12/1961 | Smith | 294/65.5 |
| 3,055,999 A | 9/1962 | Lucas | |
| 3,089,986 A | 5/1963 | Gauthier | |
| 3,102,314 A | 9/1963 | Alderfer | |
| 3,151,902 A | 10/1964 | Ahlgren | |
| 3,204,995 A | 9/1965 | Teetor | |
| 3,208,296 A | 9/1965 | Baermann | |
| 3,227,931 A | 1/1966 | Adler | |
| 3,238,399 A | 3/1966 | Johanees et al. | |
| 3,273,104 A | 9/1966 | Krol | |
| 3,288,511 A | 11/1966 | Tavano | |
| 3,301,091 A | 1/1967 | Reese | |
| 3,319,989 A * | 5/1967 | Ross | 294/65.5 |
| 3,325,758 A | 6/1967 | Cook | |
| 3,351,368 A | 11/1967 | Sweet | |
| 3,382,386 A | 5/1968 | Schlaeppi | |
| 3,408,104 A | 10/1968 | Raynes | |
| 3,414,309 A | 12/1968 | Tresemer | |
| 3,425,729 A | 2/1969 | Bisbing | |
| 3,468,576 A | 9/1969 | Beyer et al. | |
| 3,474,366 A | 10/1969 | Barney | |
| 3,500,090 A | 3/1970 | Baermann | |
| 3,521,216 A | 7/1970 | Tolegian | |
| 3,645,650 A | 2/1972 | Laing | |
| 3,668,670 A | 6/1972 | Andersen | |
| 3,684,992 A | 8/1972 | Huguet et al. | |
| 3,690,393 A | 9/1972 | Guy | |
| 3,696,258 A | 10/1972 | Anderson et al. | |
| 3,768,054 A | 10/1973 | Neugebauer | |
| 3,790,197 A | 2/1974 | Parker | |
| 3,791,309 A | 2/1974 | Baermann | |
| 3,802,034 A | 4/1974 | Bookless | |
| 3,803,433 A | 4/1974 | Ingenito | |
| 3,808,577 A | 4/1974 | Mathauser | |
| 3,836,801 A | 9/1974 | Yamashita et al. | |
| 3,845,430 A | 10/1974 | Petkewicz et al. | |
| 3,893,059 A | 7/1975 | Nowak | |
| 3,906,268 A | 9/1975 | de Graffenried | |
| 3,976,316 A | 8/1976 | Laby | |
| 4,079,558 A | 3/1978 | Gorham | |
| 4,117,431 A | 9/1978 | Eicher | |
| 4,129,846 A | 12/1978 | Yablochnikov | |
| 4,209,905 A | 7/1980 | Gillings | |
| 4,222,489 A | 9/1980 | Hutter | |
| 4,296,394 A | 10/1981 | Ragheb | |
| 4,314,219 A * | 2/1982 | Haraguchi | 335/295 |
| 4,340,833 A | 7/1982 | Sudo et al. | |
| 4,352,960 A | 10/1982 | Dormer et al. | |
| 4,355,236 A | 10/1982 | Holsinger | |
| 4,399,595 A | 8/1983 | Yoon et al. | |
| 4,401,960 A | 8/1983 | Uchikune et al. | |
| 4,416,127 A | 11/1983 | Gomez-Olea Naveda | |
| 4,451,811 A | 5/1984 | Hoffman | |
| 4,453,294 A | 6/1984 | Morita | |
| 4,517,483 A | 5/1985 | Hucker et al. | |
| 4,535,278 A | 8/1985 | Asakawa | |
| 4,547,756 A | 10/1985 | Miller et al. | |
| 4,605,911 A | 8/1986 | Jin | |
| 4,629,131 A | 12/1986 | Podell | |
| 4,645,283 A | 2/1987 | MacDonald et al. | |
| 4,680,494 A | 7/1987 | Grosjean | |
| 4,764,743 A | 8/1988 | Leupold et al. | |
| 4,808,955 A | 2/1989 | Godkin et al. | |
| 4,837,539 A | 6/1989 | Baker | |
| 4,847,582 A | 7/1989 | Cardone et al. | |
| 4,849,749 A | 7/1989 | Fukamachi et al. | |
| 4,862,128 A | 8/1989 | Leupold | |
| H693 H | 10/1989 | Leupold | |
| 4,893,103 A | 1/1990 | Leupold | |
| 4,912,727 A | 3/1990 | Schubert | |
| 4,941,236 A | 7/1990 | Sherman et al. | |
| 4,956,625 A | 9/1990 | Cardone et al. | |
| 4,980,593 A | 12/1990 | Edmundson | |
| 4,993,950 A | 2/1991 | Mensor, Jr. | |
| 4,994,778 A | 2/1991 | Leupold | |
| 4,996,457 A | 2/1991 | Hawsey et al. | |
| 5,013,949 A | 5/1991 | Mabe, Jr. | |
| 5,020,625 A | 6/1991 | Yamauchi et al. | |
| 5,050,276 A | 9/1991 | Pemberton | |
| 5,062,855 A | 11/1991 | Rincoe | |
| 5,123,843 A | 6/1992 | Van der Zel et al. | |
| 5,179,307 A | 1/1993 | Porter | |
| 5,190,325 A | 3/1993 | Doss-Desouza | |
| 5,213,307 A | 5/1993 | Perrillat-Amede | |
| 5,291,171 A | 3/1994 | Kobayashi et al. | |
| 5,302,929 A | 4/1994 | Kovacs | |
| 5,309,680 A | 5/1994 | Kiel | |
| 5,345,207 A | 9/1994 | Gebele | |
| 5,349,258 A | 9/1994 | Leupold et al. | |
| 5,367,891 A | 11/1994 | Furuyama | |
| 5,383,049 A | 1/1995 | Carr | |
| 5,394,132 A | 2/1995 | Poil | |
| 5,399,933 A | 3/1995 | Tsai | |
| 5,425,763 A | 6/1995 | Stemmann | |
| 5,440,997 A | 8/1995 | Crowley | |
| 5,461,386 A | 10/1995 | Knebelkamp | |
| 5,485,435 A | 1/1996 | Matsuda et al. | |
| 5,492,572 A | 2/1996 | Schroeder et al. | |
| 5,495,221 A | 2/1996 | Post | |
| 5,512,732 A | 4/1996 | Yagnik et al. | |
| 5,570,084 A | 10/1996 | Ritter et al. | |
| 5,582,522 A | 12/1996 | Johnson | |
| 5,604,960 A | 2/1997 | Good | |
| 5,631,093 A | 5/1997 | Perry et al. | |
| 5,631,618 A | 5/1997 | Trumper et al. | |
| 5,633,555 A | 5/1997 | Ackermann et al. | |
| 5,635,889 A | 6/1997 | Stelter | |
| 5,637,972 A | 6/1997 | Randall et al. | |
| 5,730,155 A | 3/1998 | Allen | |
| 5,742,036 A | 4/1998 | Schramm, Jr. et al. | |
| 5,759,054 A | 6/1998 | Spadafore | |
| 5,788,493 A | 8/1998 | Tanaka et al. | |
| 5,838,304 A | 11/1998 | Hall | |
| 5,852,393 A | 12/1998 | Reznik et al. | |
| 5,935,155 A | 8/1999 | Humayun et al. | |
| 5,956,778 A | 9/1999 | Godoy | |
| 5,983,406 A | 11/1999 | Meyerrose | |
| 6,000,484 A | 12/1999 | Zoretich et al. | |
| 6,039,759 A | 3/2000 | Carpentier et al. | |
| 6,047,456 A | 4/2000 | Yao et al. | |
| 6,072,251 A | 6/2000 | Markle | |
| 6,074,420 A | 6/2000 | Eaton | |
| 6,104,108 A | 8/2000 | Hazelton et al. | |
| 6,115,849 A | 9/2000 | Meyerrose | |
| 6,118,271 A | 9/2000 | Ely et al. | |
| 6,120,283 A | 9/2000 | Cousins | |
| 6,125,955 A | 10/2000 | Zoretich et al. | |
| 6,142,779 A | 11/2000 | Siegel et al. | |
| 6,170,131 B1 | 1/2001 | Shin | |
| 6,187,041 B1 | 2/2001 | Garonzik | |
| 6,188,147 B1 | 2/2001 | Hazelton et al. | |
| 6,205,012 B1 | 3/2001 | Lear | |
| 6,210,033 B1 | 4/2001 | Karkos, Jr. et al. | |
| 6,224,374 B1 | 5/2001 | Mayo | |
| 6,234,833 B1 | 5/2001 | Tsai et al. | |
| 6,241,069 B1 | 6/2001 | Mazur et al. | |
| 6,273,918 B1 | 8/2001 | Yuhasz et al. | |
| 6,275,778 B1 | 8/2001 | Shimada et al. | |
| 6,285,097 B1 | 9/2001 | Hazelton et al. | |
| 6,387,096 B1 | 5/2002 | Hyde, Jr. | |
| 6,422,533 B1 | 7/2002 | Harms | |
| 6,457,179 B1 | 10/2002 | Prendergast | |
| 6,467,326 B1 | 10/2002 | Garrigus | |
| 6,489,871 B1 | 12/2002 | Barton | |
| 6,535,092 B1 | 3/2003 | Hurley et al. | |
| 6,540,515 B1 | 4/2003 | Tanaka | |
| 6,561,815 B1 | 5/2003 | Schmidt | |
| 6,599,321 B2 | 7/2003 | Hyde, Jr. | |
| 6,607,304 B1 | 8/2003 | Lake et al. | |
| 6,652,278 B2 | 11/2003 | Honkura et al. | |

(56) References Cited

U.S. PATENT DOCUMENTS

| | | |
|---|---|---|
| 6,653,919 B2 | 11/2003 | Shih-Chung et al. |
| 6,720,698 B2 | 4/2004 | Galbraith |
| 6,747,537 B1 | 6/2004 | Mosteller |
| 6,821,126 B2 | 11/2004 | Neidlein |
| 6,841,910 B2 | 1/2005 | Gery |
| 6,842,332 B1 | 1/2005 | Rubenson et al. |
| 6,847,134 B2 | 1/2005 | Frissen et al. |
| 6,850,139 B1 | 2/2005 | Dettmann et al. |
| 6,862,748 B2 | 3/2005 | Prendergast |
| 6,864,773 B2 | 3/2005 | Perrin |
| 6,913,471 B2 | 7/2005 | Smith |
| 6,927,657 B1 | 8/2005 | Wu |
| 9,636,937 | 8/2005 | Tu et al. |
| 6,954,968 B1 | 10/2005 | Sitbon |
| 6,971,147 B2 | 12/2005 | Halstead |
| 7,009,874 B2 | 3/2006 | Deak |
| 7,016,492 B2 | 3/2006 | Pan et al. |
| 7,031,160 B2 | 4/2006 | Tillotson |
| 7,033,400 B2 | 4/2006 | Currier |
| 7,038,565 B1 | 5/2006 | Chell |
| 7,065,860 B2 | 6/2006 | Aoki et al. |
| 7,066,739 B2 | 6/2006 | McLeish |
| 7,066,778 B2 | 6/2006 | Kretzschmar |
| 7,097,461 B2 | 8/2006 | Neidlein |
| 7,101,374 B2 | 9/2006 | Hyde, Jr. |
| 7,135,792 B2 | 11/2006 | Devaney et al. |
| 7,137,727 B2 | 11/2006 | Joseph et al. |
| 7,186,265 B2 | 3/2007 | Sharkawy et al. |
| 7,224,252 B2 | 5/2007 | Meadow, Jr. et al. |
| 7,264,479 B1 | 9/2007 | Lee |
| 7,276,025 B2 | 10/2007 | Roberts et al. |
| 7,311,526 B2 | 12/2007 | Rohrbach et al. |
| 7,339,790 B2 | 3/2008 | Baker et al. |
| 7,344,380 B2 | 3/2008 | Neidlein et al. |
| 7,351,066 B2 | 4/2008 | DiFonzo et al. |
| 7,358,724 B2 | 4/2008 | Taylor et al. |
| 7,362,018 B1 | 4/2008 | Kulogo et al. |
| 7,364,433 B2 | 4/2008 | Neidlein |
| 7,381,181 B2 | 6/2008 | Lau et al. |
| 7,402,175 B2 | 7/2008 | Azar |
| 7,416,414 B2 | 8/2008 | Bozzone et al. |
| 7,438,726 B2 | 10/2008 | Erb |
| 7,444,683 B2 | 11/2008 | Prendergast et al. |
| 7,453,341 B1 | 11/2008 | Hildenbrand |
| 7,467,948 B2 | 12/2008 | Lindberg et al. |
| 7,498,914 B2 | 3/2009 | Miyashita et al. |
| 7,583,500 B2 | 9/2009 | Ligtenberg et al. |
| 7,637,746 B2 | 12/2009 | Lindberg et al. |
| 7,645,143 B2 | 1/2010 | Rohrbach et al. |
| 7,658,613 B1 | 2/2010 | Griffin et al. |
| 7,715,890 B2 | 5/2010 | Kim et al. |
| 7,762,817 B2 | 7/2010 | Ligtenberg et al. |
| 7,775,567 B2 | 8/2010 | Ligtenberg et al. |
| 7,796,002 B2 | 9/2010 | Hashimoto et al. |
| 7,799,281 B2 | 9/2010 | Cook et al. |
| 7,808,349 B2 | 10/2010 | Fullerton et al. |
| 7,812,697 B2 | 10/2010 | Fullerton et al. |
| 7,817,004 B2 | 10/2010 | Fullerton et al. |
| 7,828,556 B2 | 11/2010 | Rodrigues |
| 7,832,897 B2 | 11/2010 | Ku |
| 7,837,032 B2 | 11/2010 | Smeltzer |
| 7,839,246 B2 | 11/2010 | Fullerton et al. |
| 7,843,297 B2 | 11/2010 | Fullerton et al. |
| 7,868,721 B2 | 1/2011 | Fullerton et al. |
| 7,871,272 B2 | 1/2011 | Firman, II et al. |
| 7,874,856 B1 | 1/2011 | Schriefer et al. |
| 7,889,037 B2 | 2/2011 | Cho |
| 7,901,216 B2 | 3/2011 | Rohrbach et al. |
| 7,903,397 B2 | 3/2011 | McCoy |
| 7,905,626 B2 | 3/2011 | Shantha et al. |
| 7,997,906 B2 | 8/2011 | Ligtenberg et al. |
| 8,002,585 B2 | 8/2011 | Zhou |
| 8,009,001 B1 | 8/2011 | Cleveland |
| 8,050,714 B2 | 11/2011 | Fadell et al. |
| 8,078,224 B2 | 12/2011 | Fadell et al. |
| 8,078,776 B2 | 12/2011 | Novotney et al. |
| 8,087,939 B2 | 1/2012 | Rohrbach et al. |
| 8,099,964 B2 | 1/2012 | Saito et al. |
| 8,138,869 B1 | 3/2012 | Lauder et al. |
| 8,143,982 B1 | 3/2012 | Lauder et al. |
| 8,143,983 B1 | 3/2012 | Lauder et al. |
| 8,165,634 B2 | 4/2012 | Fadell et al. |
| 8,177,560 B2 | 5/2012 | Rohrbach et al. |
| 8,187,006 B2 * | 5/2012 | Rudisill et al. .................. 439/39 |
| 8,190,205 B2 | 5/2012 | Fadell et al. |
| 8,242,868 B2 | 8/2012 | Lauder et al. |
| 8,253,518 B2 | 8/2012 | Lauder et al. |
| 8,264,310 B2 | 9/2012 | Lauder et al. |
| 8,264,314 B2 | 9/2012 | Sankar |
| 8,271,038 B2 | 9/2012 | Fadell et al. |
| 8,271,705 B2 | 9/2012 | Novotney et al. |
| 8,297,367 B2 | 10/2012 | Chen et al. |
| 8,344,836 B2 | 1/2013 | Lauder et al. |
| 8,348,678 B2 | 1/2013 | Hardisty et al. |
| 8,354,767 B2 | 1/2013 | Pennander et al. |
| 8,390,411 B2 | 3/2013 | Lauder et al. |
| 8,390,412 B2 | 3/2013 | Lauder et al. |
| 8,390,413 B2 | 3/2013 | Lauder et al. |
| 8,395,465 B2 | 3/2013 | Lauder et al. |
| 8,398,409 B2 | 3/2013 | Schmidt |
| 8,435,042 B2 | 5/2013 | Rohrbach et al. |
| 8,454,372 B2 | 6/2013 | Lee |
| 8,467,829 B2 | 6/2013 | Fadell et al. |
| 8,497,753 B2 | 7/2013 | DiFonzo et al. |
| 8,514,042 B2 | 8/2013 | Lauder et al. |
| 8,535,088 B2 | 9/2013 | Gao et al. |
| 8,576,031 B2 | 11/2013 | Lauder et al. |
| 8,576,034 B2 | 11/2013 | Bilbrey et al. |
| 8,616,362 B1 | 12/2013 | Browne et al. |
| 8,648,679 B2 | 2/2014 | Lauder et al. |
| 8,665,044 B2 | 3/2014 | Lauder et al. |
| 8,665,045 B2 | 3/2014 | Lauder et al. |
| 8,690,582 B2 | 4/2014 | Rohrbach et al. |
| 8,702,316 B2 | 4/2014 | DiFonzo et al. |
| 8,734,024 B2 | 5/2014 | Isenhour et al. |
| 8,752,200 B2 | 6/2014 | Varshavsky et al. |
| 8,757,893 B1 | 6/2014 | Isenhour et al. |
| 8,770,857 B2 | 7/2014 | DiFonzo et al. |
| 8,774,577 B2 | 7/2014 | Benjamin et al. |
| 8,781,273 B2 | 7/2014 | Benjamin et al. |
| 2002/0125977 A1 | 9/2002 | VanZoest |
| 2003/0136837 A1 | 7/2003 | Amon et al. |
| 2003/0170976 A1 | 9/2003 | Molla et al. |
| 2003/0179880 A1 | 9/2003 | Pan et al. |
| 2003/0187510 A1 | 10/2003 | Hyde |
| 2004/0003487 A1 | 1/2004 | Reiter |
| 2004/0155748 A1 | 8/2004 | Steingroever |
| 2004/0244636 A1 | 12/2004 | Meadow et al. |
| 2004/0251759 A1 | 12/2004 | Hirzel |
| 2005/0102802 A1 | 5/2005 | Sitbon et al. |
| 2005/0196484 A1 | 9/2005 | Khoshnevis |
| 2005/0231046 A1 | 10/2005 | Aoshima |
| 2005/0240263 A1 | 10/2005 | Fogarty et al. |
| 2005/0263549 A1 | 12/2005 | Scheiner |
| 2005/0283839 A1 | 12/2005 | Cowburn |
| 2006/0066428 A1 | 3/2006 | McCarthy et al. |
| 2006/0189259 A1 | 8/2006 | Park et al. |
| 2006/0198047 A1 | 9/2006 | Xue et al. |
| 2006/0198998 A1 | 9/2006 | Raksha et al. |
| 2006/0214756 A1 | 9/2006 | Elliott et al. |
| 2006/0279391 A1 | 12/2006 | Xia |
| 2006/0290451 A1 | 12/2006 | Prendergast et al. |
| 2006/0293762 A1 | 12/2006 | Schulman et al. |
| 2007/0072476 A1 | 3/2007 | Milan |
| 2007/0075594 A1 | 4/2007 | Sadler |
| 2007/0103266 A1 | 5/2007 | Wang et al. |
| 2007/0138806 A1 | 6/2007 | Ligtenberg et al. |
| 2007/0255400 A1 | 11/2007 | Parravicini et al. |
| 2007/0267929 A1 | 11/2007 | Pulnikov et al. |
| 2008/0119250 A1 | 5/2008 | Cho et al. |
| 2008/0139261 A1 | 6/2008 | Cho et al. |
| 2008/0174392 A1 | 7/2008 | Cho |
| 2008/0181804 A1 | 7/2008 | Tanigawa et al. |
| 2008/0186683 A1 | 8/2008 | Ligtenberg et al. |

(56) References Cited

U.S. PATENT DOCUMENTS

| | | | |
|---|---|---|---|
| 2008/0218299 A1 | 9/2008 | Arnold | |
| 2008/0224806 A1 | 9/2008 | Ogden et al. | |
| 2008/0272868 A1 | 11/2008 | Prendergast et al. | |
| 2008/0272872 A1* | 11/2008 | Fiedler | 335/295 |
| 2008/0282517 A1 | 11/2008 | Claro | |
| 2009/0021333 A1 | 1/2009 | Fiedler | |
| 2009/0209173 A1 | 8/2009 | Arledge et al. | |
| 2009/0250574 A1* | 10/2009 | Fullerton et al. | 248/206.5 |
| 2009/0250576 A1 | 10/2009 | Fullerton et al. | |
| 2009/0251256 A1* | 10/2009 | Fullerton et al. | 335/296 |
| 2009/0254196 A1 | 10/2009 | Cox et al. | |
| 2009/0273422 A1* | 11/2009 | Fullerton et al. | 335/306 |
| 2009/0278642 A1 | 11/2009 | Fullerton et al. | |
| 2009/0289090 A1 | 11/2009 | Fullerton et al. | |
| 2009/0289749 A1 | 11/2009 | Fullerton et al. | |
| 2009/0292371 A1 | 11/2009 | Fullerton et al. | |
| 2010/0033280 A1 | 2/2010 | Bird et al. | |
| 2010/0126857 A1 | 5/2010 | Polwart et al. | |
| 2010/0167576 A1 | 7/2010 | Zhou | |
| 2011/0026203 A1 | 2/2011 | Ligtenberg et al. | |
| 2011/0085157 A1 | 4/2011 | Bloss et al. | |
| 2011/0101088 A1 | 5/2011 | Marguerettaz et al. | |
| 2011/0210636 A1 | 9/2011 | Kuhlmann-Wilsdorf | |
| 2011/0234344 A1 | 9/2011 | Fullerton et al. | |
| 2011/0248806 A1* | 10/2011 | Michael | 335/295 |
| 2011/0279206 A1 | 11/2011 | Fullerton et al. | |
| 2012/0007704 A1 | 1/2012 | Nerl | |
| 2012/0064309 A1 | 3/2012 | Kwon et al. | |
| 2012/0085753 A1 | 4/2012 | Fitch et al. | |
| 2012/0235519 A1 | 9/2012 | Dyer et al. | |
| 2013/0001745 A1 | 1/2013 | Iwaki | |
| 2013/0186209 A1 | 7/2013 | Herbst | |
| 2013/0186473 A1 | 7/2013 | Mankame et al. | |
| 2013/0186807 A1 | 7/2013 | Browne et al. | |
| 2013/0187538 A1 | 7/2013 | Herbst | |
| 2013/0192860 A1 | 8/2013 | Puzio et al. | |
| 2013/0207758 A1 | 8/2013 | Browne et al. | |
| 2013/0252375 A1 | 9/2013 | Yi et al. | |
| 2013/0256274 A1 | 10/2013 | Faulkner | |
| 2013/0270056 A1 | 10/2013 | Mankame et al. | |
| 2013/0305705 A1 | 11/2013 | Ac et al. | |
| 2013/0341137 A1 | 12/2013 | Mandame et al. | |
| 2014/0044972 A1 | 2/2014 | Menassa et al. | |
| 2014/0072261 A1 | 3/2014 | Isenhour et al. | |
| 2014/0152252 A1 | 6/2014 | Wood et al. | |
| 2014/0205235 A1 | 7/2014 | Benjamin et al. | |
| 2014/0221741 A1 | 8/2014 | Wang et al. | |

FOREIGN PATENT DOCUMENTS

| | | | |
|---|---|---|---|
| DE | 2938782 A1 | | 4/1981 |
| EP | 0 345 554 A1 | | 12/1989 |
| EP | 0 545 737 A1 | | 6/1993 |
| FR | 823395 A | | 1/1938 |
| GB | 444786 A | * | 3/1936 |
| GB | 1 495 677 A | | 12/1977 |
| JP | 557-55908 U | | 4/1982 |
| JP | 557-189423 U | | 12/1982 |
| JP | 60-091011 U | | 6/1985 |
| JP | 60-221238 A | | 11/1985 |
| JP | 64-30444 A | | 2/1989 |
| JP | 2001-328483 A | | 11/2001 |
| JP | 2008035676 A | | 2/2008 |
| JP | 2008165974 A | | 7/2008 |
| JP | 05-038123 B2 | | 10/2012 |
| WO | WO-02/31945 A2 | | 4/2002 |
| WO | WO-2007/081830 A2 | | 7/2007 |
| WO | WO-2009/124030 A1 | | 10/2009 |
| WO | WO-2010/141324 A1 | | 12/2010 |

OTHER PUBLICATIONS

Atallah et al., 2001, "A Novel High-Performance Magnetic Gear", IEEE Transactions on Magnetics, vol. 37, No. 4, Jul. 2001, p. 2844-46.

Bassani, 2007, "Dynamic Stability of Passive Magnetic Bearings", Nonlinear Dynamics, V. 50, p. 161-68.

BNS 33 Range, Magnetic safety sensors, Rectangular design, http://www.farnell.com/datasheets/36449.pdf, 3 pages, date unknown.

Boston Gear 221S-4, One-stage Helical Gearbox, http://www.bostongear.com/pdf/product_sections/200_series_helical.pdf, referenced Jun. 2010.

Charpentier et al., 2001, "Mechanical Behavior of Axially Magnetized Permanent-Magnet Gears", IEEE Transactions on Magnetics, vol. 37, No. 3, May 2001, p. 1110-17.

Chau et al., 2008, "Transient Analysis of Coaxial Magnetic Gears Using Finite Element Comodeling", Journal of Applied Physics, vol. 103.

Choi et al., 2010, "Optimization of Magnetization Directions in a 3-D Magnetic Structure", IEEE Transactions on Magnetics, vol. 46, No. 6, Jun. 2010, p. 1603-06.

Correlated Magnetics Research, 2009, Online Video, "Innovative Magnetics Research in Huntsville", http://www.youtube.com/watch?v=m4m81JjZCJo.

Correlated Magnetics Research, 2009, Online Video, "Non-Contact Attachment Utilizing Permanent Magnets", http://www.youtube.com/watch?v=3xUm25CNNgQ.

Correlated Magnetics Research, 2010, Company Website, http://www.correlatedmagnetics.com.

Furlani 1996, "Analysis and optimization of synchronous magnetic couplings", J. Appl. Phys., vol. 79, No. 8, p. 4692.

Furlani 2001, "Permanent Magnet and Electromechanical Devices", Academic Press, San Diego.

Furlani, E.P., 2000, "Analytical analysis of magnetically coupled multipole cylinders", J. Phys. D: Appl. Phys., vol. 33, No. 1, p. 28-33.

General Electric DP 2.7 Wind Turbine Gearbox, http://www.gedrivetrain.com/insideDP27.cfm, referenced Jun. 2010.

Ha et al., 2002, "Design and Characteristic Analysis of Non-Contact Magnet Gear for Conveyor by Using Permanent Magnet", Conf. Record of the 2002 IEEE Industry Applications Conference, p. 1922-27.

Huang et al., 2008, "Development of a Magnetic Planetary Gearbox", IEEE Transactions on Magnetics, vol. 44, No. 3, p. 403-12.

International Search Report and Written Opinion dated Jun. 1, 2009, directed to counterpart application No. PCT/US2009/002027. (10 pages).

International Search Report and Written Opinion of the International Searching Authority issued in Application No. PCT/US12/61938 dated Feb. 26, 2013.

International Search Report and Written Opinion of the International Searching Authority issued in Application No. PCT/US2013/028095 dated May 13, 2013.

International Search Report and Written Opinion of the International Searching Authority issued in Application No. PCT/US2013/047986 dated Nov. 21, 2013.

International Search Report and Written Opinion, dated Apr. 8, 2011 issued in related International Application No. PCT/US2010/049410.

International Search Report and Written Opinion, dated Aug. 18, 2010, issued in related International Application No. PCT/US2010/036443.

International Search Report and Written Opinion, dated Jul. 13, 2010, issued in related International Application No. PCT/US2010/021612.

International Search Report and Written Opinion, dated May 14, 2009, issued in related International Application No. PCT/US2009/038925.

Jian et al., "Comparison of Coaxial Magnetic Gears With Different Topologies", IEEE Transactions on Magnetics, vol. 45, No. 10, Oct. 2009, p. 4526-29.

Jian et al., 2010, "A Coaxial Magnetic Gear With Halbach Permanent-Magnet Arrays", IEEE Transactions on Energy Conversion, vol. 25, No. 2, Jun. 2010, p. 319-28.

Jørgensen et al., "The Cycloid Permanent Magnetic Gear", IEEE Transactions on Industry Applications, vol. 44, No. 6, Nov./Dec. 2008, p. 1659-65.

(56) References Cited

OTHER PUBLICATIONS

Jørgensen et al., 2005, "Two dimensional model of a permanent magnet spur gear", Conf. Record of the 2005 IEEE Industry Applications Conference, p. 261-5.
Kim, "A future cost trends of magnetizer systems in Korea", Industrial Electronics, Control, and Instrumentation, 1996, vol. 2, Aug. 5, 1996, pp. 991-996.
Krasil'nikov et al., 2008, "Calculation of the Shear Force of Highly Coercive Permanent Magnets in Magnetic Systems With Consideration of Affiliation to a Certain Group Based on Residual Induction", Chemical and Petroleum Engineering, vol. 44, Nos. 7-8, p. 362-65.
Krasil'nikov et al., 2009, "Torque Determination for a Cylindrical Magnetic Clutch", Russian Engineering Research, vol. 29, No. 6, pp. 544-547.
Liu et al., 2009, "Design and Analysis of Interior-magnet Outer-rotor Concentric Magnetic Gears", Journal of Applied Physics, vol. 105.
Lorimer et al., 1997, "Magnetization Pattern for Increased Coupling in Magnetic Clutches", IEEE Transactions on Magnetics, vol. 33, No. 5, Sep. 1997.
Mezani et al., 2006, "A high-performance axial-field magnetic gear", Journal of Applied Physics vol. 99.
Mi, "Magnetreater/Charger Model 580" Magnetic Instruments Inc. Product specification, May 4, 2009, http://web.archive.org/web/20090504064511/http://www.maginst.com/specifications/580_magnetreater.htm, 2 pages.
Neugart PLE-160, One-Stage Planetary Gearbox, http://www.neugartusa.com/ple_160_gb.pdf, referenced Jun. 2010.
Series BNS, Compatible Series AES Safety Controllers, http://www.schmersalusa.com/safety_controllers/drawings/aes.pdf, pp. 159-175, date unknown.
Series BNS-B20, Coded-Magnet Sensorr Safety Door Handle, http://www.schmersalusa.com/catalog_pdfs/BNS_B20.pdf, 2pages, date unknown.
Series BNS333, Coded-Magnet Sensors with Integral Safety Control Module, http://www.schmersalusa.com/machine_guarding/coded_magnet/drawings/bns333.pdf, 2 pages, date unknown.
Tsurumoto 1992, "Basic Analysis on Transmitted Force of Magnetic Gear Using Permanent Magnet", IEEE Translation Journal on Magnetics in Japan, Vo 7, No. 6, Jun. 1992, p. 447-52.
United States Office Action issued in U.S. Appl. No. 13/104,393 dated Apr. 4, 2013.
United States Office Action issued in U.S. Appl. No. 13/236,413 dated Jun. 6, 2013.
United States Office Action issued in U.S. Appl. No. 13/246,584 dated May 16, 2013.
United States Office Action issued in U.S. Appl. No. 13/374,074 dated Feb. 21, 2013.
United States Office Action issued in U.S. Appl. No. 13/430,219 dated Aug. 13, 2013.
United States Office Action issued in U.S. Appl. No. 13/470,994 dated Aug. 8, 2013.
United States Office Action issued in U.S. Appl. No. 13/470,994 dated Jan. 7, 2013.
United States Office Action issued in U.S. Appl. No. 13/529,520 dated Sep. 28, 2012.
United States Office Action issued in U.S. Appl. No. 13/530,893 dated Mar. 22, 2013.
United States Office Action issued in U.S. Appl. No. 13/855,519 dated Jul. 17, 2013.
United States Office Action, dated Aug. 26, 2011, issued in U.S. Appl. No. 12/206,270.
United States Office Action, dated Feb. 2, 2011, issued in U.S. Appl. No. 12/476,952.
United States Office Action, dated Mar. 12, 2012, issued in U.S. Appl. No. 12/206,270.
United States Office Action, dated Mar. 9, 2012, issued in U.S. Appl. No. 13/371,280.
United States Office Action, dated Oct. 12, 2011, issued in U.S. Appl. No. 12/476,952.
United States Office Action issued in U.S. Appl. No. 13/246,584 dated Oct. 15, 2013.
United States Office Action issued in U.S. Appl. No. 13/687,819 dated Apr. 29, 2014.
United States Office Action issued in U.S. Appl. No. 13/718,839 dated Dec. 16, 2013.
United States Office Action issued in U.S. Appl. No. 13/470,994 dated Nov. 8, 2013.
United States Office Action issued in U.S. Appl. No. 13/530,893 dated Oct. 29, 2013.
United States Office Action issued in U.S. Appl. No. 13/928,126 dated Oct. 11, 2013.
Wikipedia, "Barker Code", Web article, last modified Aug. 2, 2008, 2 pages.
Wikipedia, "Bitter Electromagnet", Web article, last modified Aug. 2011, 1 page.
Wikipedia, "Costas Array", Web article, last modified Oct. 7, 2008, 4 pages.
Wikipedia, "Gold Code", Web article, last modified Jul. 27, 2008, 1 page.
Wikipedia, "Golomb Ruler", Web article, last modified Nov. 4, 2008, 3 pages.
Wikipedia, "Kasami Code", Web article, last modified Jun. 11, 2008, 1 page.
Wikipedia, "Linear feedback shift register", Web article, last modified Nov. 11, 2008, 6 pages.
Wikipedia, "Walsh Code", Web article, last modified Sep. 17, 2008, 2 pages.
C. Pompermaier, L. Sjoberg, and G. Nord, Design and Optimization of a Permanent Magnet Transverse Flux Machine, XXth International Conference on Electrical Machines, Sep. 2012, p. 606, IEEE Catalog No. CFP1290B-PRT, ISBN: 978-1-4673-0143-5.
V. Rudnev, An Objective Assessment of Magnetic Flux Concentrators, Het Trating Progress, Nov./Dec. 2004, p. 19-23.

* cited by examiner

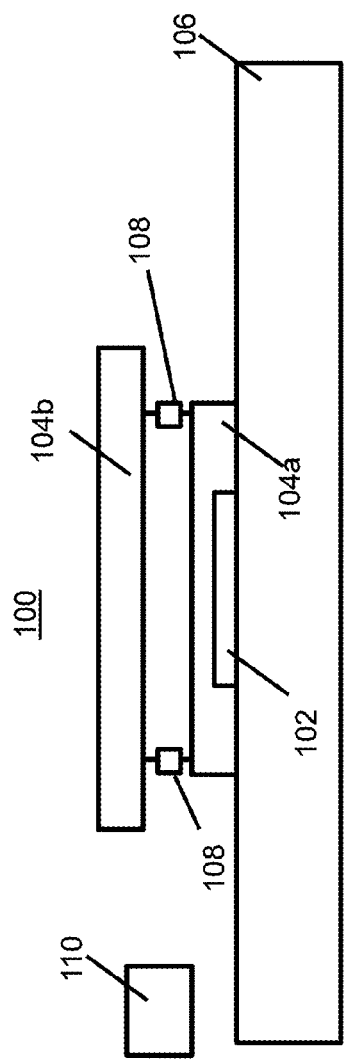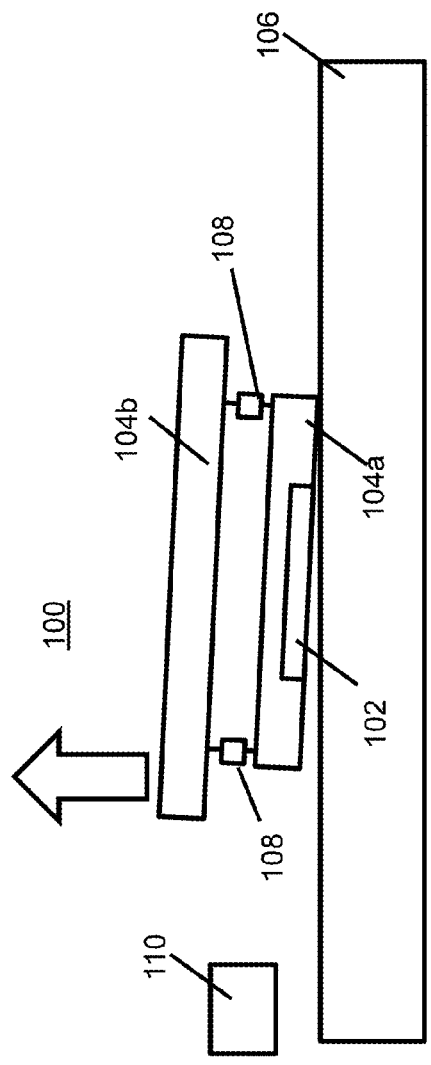

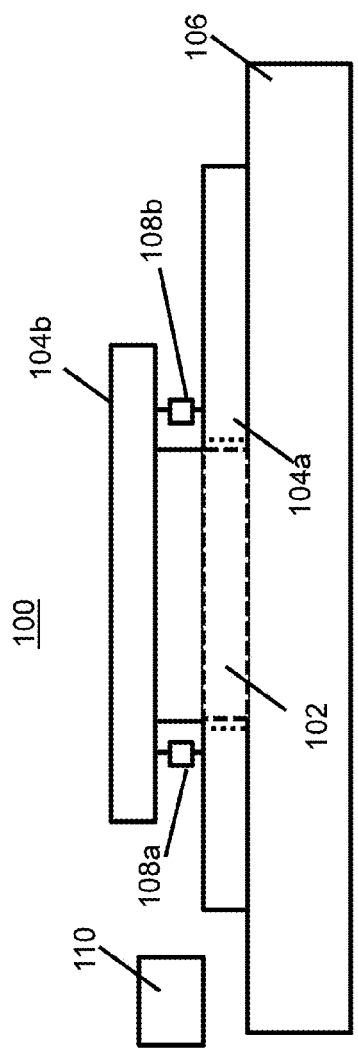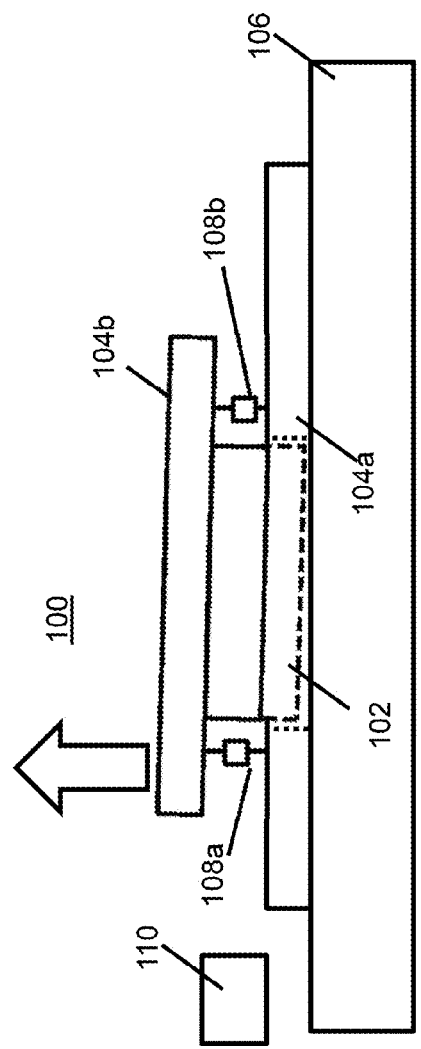

INTELLIGENT MAGNETIC SYSTEM

RELATED APPLICATIONS

This application is a continuation-in-part of non-provisional application Ser. No. 13/779,611, titled "System for Detaching a Magnetic Structure from a Ferromagnetic Material", filed Feb. 27, 2013 by Fullerton et al., and claims the benefit under 35 USC 119(e) of provisional application 61/735,460, titled "An Intelligent Magnetic System", filed Dec. 10, 2012 by Fullerton et al.; Ser. No. 13/779,611 claims the benefit under 35 USC 119(e) of provisional application 61/640,979, titled "System for Detaching a Magnetic Structure from a Ferromagnetic Material", filed May 1, 2012 by Fullerton et al. and provisional application 61/604,376, titled "System for Detaching a Magnetic Structure from a Ferromagnetic Material", filed Feb. 28, 2012 by Fullerton et al.

This application is also a continuation-in-part of non-provisional application Ser. No. 14/066,426, titled "System and Method for Affecting Flux of Magnetic Structures", filed Oct. 29, 2013 by Fullerton et al., which is a continuation of non-provisional application Ser. No. 13/374,074, titled "System and Method for Affecting Flux of Multi-Pole Magnetic Structures", filed Dec. 9, 2011 by Fullerton et al., which claims the benefit under 35 USC 119(e) of provisional application 61/459,994, titled "System and Method for Affecting Flux of Magnetic Structures", filed Dec. 22, 2010 by Fullerton et al.

This application is also a continuation-in-part of non-provisional application Ser. No. 14/086,924, titled "System and Method for Positioning a Multi-Pole Magnetic Structure" filed Nov. 21, 2013 by Fullerton et al. which claims the benefit under 35 USC 119(e) of provisional application 61/796,863, titled "System for Determining a Position of a Multi-pole Magnetic Structure", filed Nov. 21, 2012 by Roberts; Ser. No. 14/086,924 is a continuation-in-part of non-provisional application Ser. No. 14/035,818, titled "Magnetic Structures and Methods for Defining Magnetic Structures Using One-Dimensional Codes" filed Sep. 24, 2013 by Fullerton et al. which claims the benefit under 35 USC 119(e) of provisional application 61/796,863, titled "System for Determining a Position of a Multi-pole Magnetic Structure", filed Nov. 21, 2012 by Roberts; Ser. No. 14/035,818 is a continuation-in-part of non-provisional application Ser. No. 13/959,649, titled "Magnetic Device Using Non Polarized Magnetic Attraction Elements" filed Aug. 5, 2013 by Richards et al. which claims the benefit under 35 USC 119(e) of provisional application 61/744,342, titled "Magnetic Structures and Methods for Defining Magnetic Structures Using One-Dimensional Codes", filed Sep. 24, 2012 by Roberts; Ser. No. 13/959,649 is a continuation-in-part of non-provisional Application Ser. No. 13/759,695, titled: "System and Method for Defining Magnetic Structures" filed Feb. 5, 2013 by Fullerton et al., which is a continuation of application Ser. No. 13/481,554, titled: "System and Method for Defining Magnetic Structures", filed May 25, 2012, by Fullerton et al., now U.S. Pat. No. 8,368,495; which is a continuation-in-part of non-provisional application Ser. No. 13/351,203, titled "A Key System For Enabling Operation Of A Device", filed Jan. 16, 2012, by Fullerton et al., now U.S. Pat. No. 8,314,671; Ser. No. 13/481,554 also claims the benefit under 35 USC 119(e) of provisional application 61/519,664, titled "System and Method for Defining Magnetic Structures", filed May 25, 2011 by Roberts et al.; Ser. No. 13/351,203 is a continuation of application Ser. No. 13/157,975, titled "Magnetic Attachment System With Low Cross Correlation", filed Jun. 10, 2011, by Fullerton et al., U.S. Pat. No. 8,098,122, which is a continuation of application Ser. No. 12/952,391, titled: "Magnetic Attachment System", filed Nov. 23, 2010 by Fullerton et al., now U.S. Pat. No. 7,961,069; which is a continuation of application Ser. No. 12/478,911, titled "Magnetically Attachable and Detachable Panel System" filed Jun. 5, 2009 by Fullerton et al., now U.S. Pat. No. 7,843,295; Ser. No. 12/952,391 is also a continuation of application Ser. No. 12/478,950, titled "Magnetically Attachable and Detachable Panel Method," filed Jun. 5, 2009 by Fullerton et al., now U.S. Pat. No. 7,843,296; Ser. No. 12/952,391 is also a continuation of application Ser. No. 12/478,969, titled "Coded Magnet Structures for Selective Association of Articles," filed Jun. 5, 2009 by Fullerton et al., now U.S. Pat. No. 7,843,297; Ser. No. 12/952,391 is also a continuation of application Ser. No. 12/479,013, titled "Magnetic Force Profile System Using Coded Magnet Structures," filed Jun. 5, 2009 by Fullerton et al., now U.S. Pat. No. 7,839,247; the preceding four applications above are each a continuation-in-part of Non-provisional application Ser. No. 12/476,952 filed Jun. 2, 2009, titled "A Field Emission System and Method", by Fullerton et al., now U.S. Pat. No. 8,179,219, which is a continuation-in-part of Non-provisional application Ser. No. 12/322,561, filed Feb. 4, 2009 titled "System and Method for Producing an Electric Pulse", by Fullerton et al., now U.S. Pat. No. 8,115,581, which is a continuation-in-part of Non-provisional application Ser. No. 12/358,423, filed Jan. 23, 2009 titled "A Field Emission System and Method", by Fullerton et al., U.S. Pat. No. 7,868,721.

This patent application is also a continuation-in-part of U.S. patent application Ser. No. 13/918,921, filed Jun. 15, 2013 titled "Detachable Cover System", by Fullerton et al., which is a continuation application of U.S. patent application Ser. No. 13/629,879, filed Sep. 28, 2012, now U.S. Pat. No. 8,514,046, which is a continuation of U.S. patent application Ser. No. 13/426,909, filed Mar. 22, 2012, now U.S. Pat. No. 8,279,032, which claims the benefit of U.S. Provisional Application Ser. No. provisional application 61/465,810 (filed Mar. 24, 2011), which is a continuation-in-part of U.S. non-provisional patent application Ser. No. 13/179,759 (filed Jul. 11, 2011), now U.S. Pat. No. 8,174,347.

This non-provisional patent application is a continuation-in-part of U.S. non-provisonal patent application Ser. No. 14/045,756, filed Oct. 3, 2013, which is entitled "System and Method for Tailoring Transition Regions of Magnetic Structures", which claims the benefit of U.S. provisional patent application 61/744,864, filed Oct. 4, 2012, which is entitled "System And Method for Tailoring Polarity Transitions of Magnetic Structures"; and this non-provisional patent application is a continuation-in-part of U.S. non-provisional patent application Ser. No. 13/240,335, filed Sep. 22, 2011, which is entitled "Magnetic Structure Production", which claims the benefit of U.S. provisional patent application 61/403,814, filed Sep. 22, 2010 and U.S. provisional patent application 61/462,715, filed Feb. 7, 2011, both of which are entitled "System And Method For Producing Magnetic Structures"; Ser. No. 13/240,335 is a continuation-in-part of U.S. non-provisional patent application Ser. No. 12/476,952, filed Jun. 2, 2009, now U.S. Pat. No. 8,179,219, which is entitled "Field Emission System And Method"; Ser. No. 13/240,335 is also a continuation-in-part of U.S. non-provisional patent application Ser. No. 12/895,589 (filed Sep. 30, 2010), which is entitled "A System And Method For Energy Generation", which claims the benefit of provisional patent application 61/277,214, filed Sep. 22, 2009, 61/277,900, filed Sep. 30, 2009, 61/278,767, filed Oct. 9, 2009, 61/289,094, filed Oct. 16, 2009, 61/281,160, filed Nov. 13, 2009, 61/283,780, filed Dec. 9, 2009, 61/284,385, filed Dec. 17, 2009, and 61/342,988, filed Apr. 22, 2010, which is a continuation-in-part of Ser. No. 12/885,450, filed Sep. 18, 2010, now U.S. Pat. No. 7,982,568 and Ser. No. 12/476,952, filed Jun. 2, 2009, now U.S. Pat. No. 8,179,219; Ser. No. 14/045,756 is also a continuation-in-part of U.S. non-provisional patent application Ser. No. 13/246,584, filed Sep. 27, 2011, which is entitled "System and Method for Producing Stacked Field Emission Structures".

The contents of the provisional patent applications, the contents of the non-provisional patent applications, and the contents of the issued patents that are identified above are hereby incorporated by reference in their entirety herein.

FIELD OF THE INVENTION

The present invention relates generally to an intelligent magnetic system. More particularly, the present invention relates to a magnetic system including a multi-pole magnetic structure, one or more sensors to monitor data relating to the magnetic structure, and a control system for receiving the data and using it to manage the use of the magnetic system.

SUMMARY OF THE INVENTION

An intelligent magnetic system includes a first piece of ferromagnetic material, a shunt plate, at least one simple machine, at least one sensor, and a control system. The first piece of ferromagnetic material has a first side and a second side opposite the first side and has magnetically printed field sources that extend from the first side to the second side. The magnetically printed field sources have a first multi-polarity pattern and the first side of the first piece of ferromagnetic material is magnetically attached to a second piece of ferromagnetic material.

The shunt plate is disposed on the second side of the first piece of ferromagnetic material for routing magnetic flux through the first piece of ferromagnetic material from the second side to the first side of said first piece of ferromagnetic material.

The as least one simple machine amplifies an applied force into a detachment force that creates an angled spacing between the first piece of ferromagnetic material and the second piece of ferromagnetic material.

The at least one sensor produces sensor data that the control system monitors in order to manage the use of the first ferromagnetic material.

The at least one sensor may measure at least one of a lift force being applied to the intelligent magnetic system or the magnetic force between the first piece of ferromagnetic material and the second piece of said ferromagnetic material.

The second piece of ferromagnetic material may have magnetically printed field sources having a second multi-polarity pattern that is complementary to the first multi-polarity pattern.

The intelligent magnetic system may include the second piece of ferromagnetic material.

The at least one sensor may measure a magnetic field.
The at least one sensor may measure a tensile force.
The at least one sensor may measure a shear force.
The at least one sensor may measure a torque.
The at least one sensor may measure may include at least one of a temperature sensor, a barometric sensor, an accelerometer, a capacitive sensor, an electrical sensor, an optical sensor, an ultrasonic sensor, or a vibration sensor.

The control system may characterize the sensor data as being within an acceptable range or being outside an acceptable range.

The control system may provide a warning indication when the control system characterizes the sensor data as being outside an acceptable range, where a warning indication may be at least one of a visual indication or an audio indication.

The sensor data may be used to control a magnetic property of the first ferromagnetic material or the second ferromagnetic material.

The sensor data may be conveyed from the at least one sensor to the control system using a wire or wirelessly.

A property of the first ferromagnetic material or the second ferromagnetic material may be modulated to convey information to the sensor.

The sensor data may correspond to temperature information that may be used to automatically adjust a property of the first ferromagnetic material or the second ferromagnetic material in order to compensate for temperature-related force variations.

The at least one sensor may measure a separation distance between the first ferromagnetic material and the second ferromagnetic material.

The at least one sensor may be used to determine whether the intelligent magnetic system is in motion.

The at least one sensor may be used to track movement of the intelligent magnetic system.

BRIEF SUMMARY OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

FIGS. 3A and 3B depict an embodiment of a magnetic system comprising one or more sensors for measuring forces between first and second structural elements.

FIGS. 4A and 4B depict an alternative embodiment of a magnetic system comprising one or more sensors for measuring forces between first and second structural elements.

DETAILED DESCRIPTION OF THE INVENTION

Figure 1A:
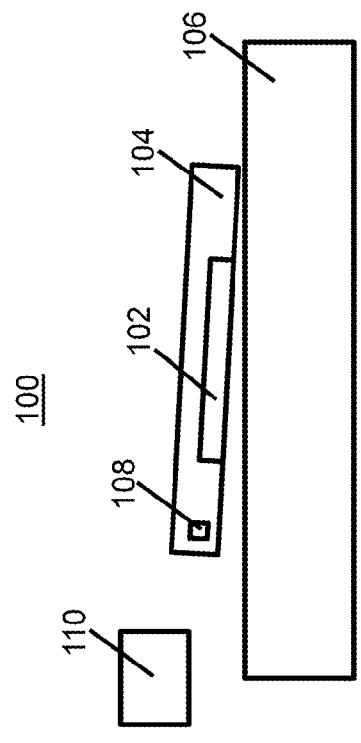
FIGS. 1A and 1B depict a first exemplary intelligent magnetic system in accordance with the invention.

The present invention will now be described more fully in detail with reference to the accompanying drawings, in which the preferred embodiments of the invention are shown. This invention should not, however, be construed as limited to the embodiments set forth herein; rather, they are provided so that this disclosure will be thorough and complete and will fully convey the scope of the invention to those skilled in the art.

Certain described embodiments may relate, by way of example but not limitation, to systems and/or apparatuses comprising magnetic structures, magnetic and non-magnetic materials, methods for using magnetic structures, magnetic structures produced via magnetic printing, magnetic structures comprising arrays of discrete magnetic elements, combinations thereof, and so forth. Example realizations for such embodiments may be facilitated, at least in part, by the use of an emerging, revolutionary technology that may be termed correlated magnetics. This revolutionary technology referred to herein as correlated magnetics was first fully described and enabled in the co-assigned U.S. Pat. No. 7,800,471 issued on Sep. 21, 2010, and entitled "A Field Emission System and Method". The contents of this document are hereby incorporated herein by reference. A second generation of a correlated magnetic technology is described and enabled in the co-assigned U.S. Pat. No. 7,868,721 issued on Jan. 11, 2011, and entitled "A Field Emission System and Method". The contents of this document are hereby incorporated herein by reference. A third generation of a correlated magnetic technology is described and enabled in the co-assigned U.S. Pat. No. 8,179,219, issued May 15, 2012, and entitled "A Field Emission System and Method". The contents of this document are hereby incorporated herein by reference. Another technology known as correlated inductance, which is related to correlated magnetics, has been described and enabled in the co-assigned U.S. Pat. No. 8,115,581 issued on Feb. 14, 2012, and entitled "A System and Method for Producing an Electric Pulse". The contents of this document are hereby incorporated by reference.

Material presented herein may relate to and/or be implemented in conjunction with multilevel correlated magnetic systems and methods for producing a multilevel correlated magnetic system such as described in U.S. Pat. No. 7,982,568 issued Jul. 19, 2011 which is all incorporated herein by reference in its entirety. Material presented herein may relate to and/or be implemented in conjunction with energy generation systems and methods such as described in U.S. patent application Ser. No. 13/184,543 filed Jul. 17, 2011, which is all incorporated herein by reference in its entirety. Such systems and methods described in U.S. Pat. No. 7,681,256 issued Mar. 23, 2010, U.S. Pat. No. 7,750,781 issued Jul. 6, 2010, U.S. Pat. No. 7,755,462 issued Jul. 13, 2010, U.S. Pat. No. 7,812, 698 issued Oct. 12, 2010, U.S. Pat. Nos. 7,817,002, 7,817, 003, 7,817,004, 7,817,005, and 7,817,006 issued Oct. 19, 2010, U.S. Pat. No. 7,821,367 issued Oct. 26, 2010, U.S. Pat. Nos. 7,823,300 and 7,824,083 issued Nov. 2, 2011, U.S. Pat. No. 7,834,729 issued Nov. 16, 2011, U.S. Pat. No. 7,839,247 issued Nov. 23, 2010, U.S. Pat. Nos. 7,843,295, 7,843,296, and 7,843,297 issued Nov. 30, 2010, U.S. Pat. No. 7,893,803 issued Feb. 22, 2011, U.S. Pat. Nos. 7,956,711 and 7,956,712 issued Jun. 7, 2011, U.S. Pat. Nos. 7,958,575, 7,961,068 and 7,961,069 issued Jun. 14, 2011, U.S. Pat. No. 7,963,818 issued Jun. 21, 2011, and U.S. Pat. Nos. 8,015,752 and 8,016, 330 issued Sep. 13, 2011, and U.S. Pat. No. 8,035,260 issued Oct. 11, 2011 are all incorporated by reference herein in their entirety.

Material presented herein may relate to and/or be implemented in conjunction with systems and methods described in U.S. Provisional Patent Application 61/640,979, filed May 1, 2012 titled "System for Detaching a Magnetic Structure from a Ferromagnetic Material", which is incorporated herein by reference. Material may also relate to systems and methods described in U.S. Provisional Patent Application 61/796,253, filed Nov. 5, 2012 titled "System for Controlling Magnetic Flux of a Multi-pole Magnetic Structure", which is incorporated herein by reference. Material may also relate to systems and methods described in U.S. Provisional Patent Application 61/735,403, filed Dec. 10, 2012 titled "System for Concentrating Magnetic Flux of a Multi-pole Magnetic Structure", which is incorporated herein by reference.

The basic use of sensors with a correlated field emission system has been previously described in U.S. Pat. Nos. 7,868, 721 and 8,179,219, which are referenced above. The present invention relates to intelligent magnetic systems where sensor data is used to control the use of a magnetic structure. One or more sensors are used to collect data relating to a multi-pole magnetic structure. The sensor data is monitored by a control system and used to manage the use of the magnetic structure. The one or more sensors may include, for example, a temperature sensor, a barometric sensor, an accelerometer, a Hall Effect sensor, a force sensor, a magnetometer, a capacitive, an electrical sensor such as an inductor coil, an optical sensor, a vibration sensor, etc. Data provided by a given sensor may be characterized by the control system as being within an acceptable range or being outside an acceptable range in which case the control system can provide a user of the magnetic system a warning indication, which might be a visual indication (e.g., a flashing red light) or an audio indication (e.g., an alarm sound). Data provided by a given sensor may also be used to control a magnetic property of a magnetic structure during its use. Data may be conveyed from a sensor and a control system using a wire or conveyed wirelessly using any well-known communications method. A property of the magnetic structure can also be modulated to convey information to a sensor associated with a control system.

Figure 1B:
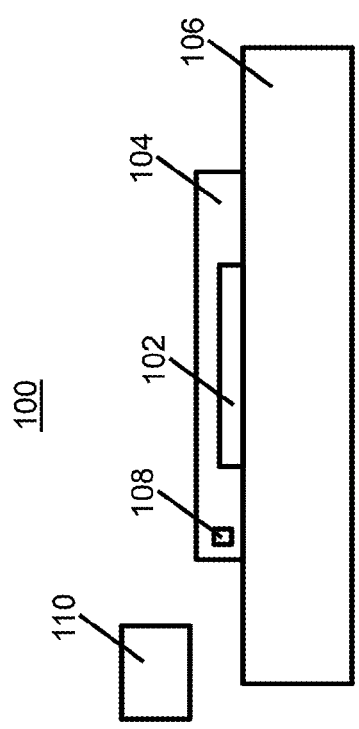

FIGS. 1A and 1B depicts an exemplary intelligent magnetic system 100 in accordance with the invention, where a sensor is in a fixed position relative to a magnetic structure. Referring to FIGS. 1A and 1B, an intelligent magnetic system 100 includes a magnetic structure 102 that is associated with a structural element 104. For example, the magnetic structure 102 may be attached to the structural element 104 by an adhesive. The magnetic structure 102 is shown attached to a target 106, which could be a piece of ferromagnetic material (as shown) but could alternatively be another magnetic structure 102. A sensor 108 is integrated into the structural element 104 and provides data to a control system 110. When the structural element moves, as shown in FIG. 1B, the relative positions of the magnetic structure 102 and sensor 108 remain constant.

Figure 2A:
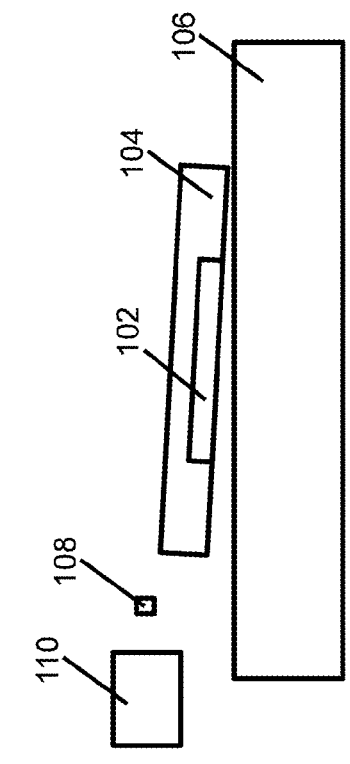
FIGS. 2A and 2B depict a second exemplary intelligent magnetic system in accordance with the invention.
Figure 2B:
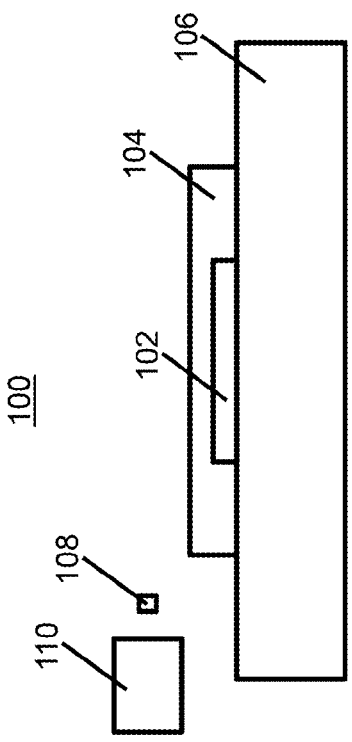

FIGS. 2A and 2B depict an exemplary magnetic system 100 in accordance with the invention, where the sensor remains in a fixed location independent of the magnetic structure such that the position of the sensor relative to the magnetic structure varies as the magnetic structure moves.

Data provided by a temperature sensor can be used to determine whether an environment is adversely affecting a magnetic structure. For a given magnetic structure, parameters relating to the susceptibility of the material used in the magnetic structure to temperature can be used to establish an acceptable temperature range used to compare to sensor data. Moreover, variations in forces produced by the magnetic structure resulting from temperature variations can be taken into account by a control system. For magnetic systems whereby magnetic fields can be varied, temperature information may be used to automatically adjust a magnetic structure or a magnetic circuit relating to a magnetic structure in order to compensate for temperature-related force variations.

An accelerometer can be used to determine whether a magnetic system is in motion and to track its movement along a movement path. Such data can be used to control magnetic structure properties. For example, in a robotic application where the magnetic system is used to pick up sheets of metal that are stacked, it may be desirable to set a magnetic field parameter such that the system will only pick up one sheet of metal but once the metal has been picked up, detected movement of the magnetic system may indicate that the magnetic field parameter can be increased until some other movement indicates that the magnetic structure is again about to be used to pick up a piece of metal off of the stack. As such, the field strength can be controlled to vary from a minimum field desired to only pick up one piece of metal to some higher field strength used to handle the metal once it has been removed from the stack.

A Hall Effect sensor placed at a known location relative to a magnetic structure can be used to determine any change to the field produced by the magnetic structure such as demagnetization of the structure. The Hall Effect sensor may also detect presence of an approaching magnetic structure, movement of the magnetic structure along a known movement path, etc. One or more Hall Effect sensors can be used as part of a quality control system, for example to determine if a printed magnetic structure has been properly printed with the desired maxel pattern. Such sensors can be used to detect problems with printed magnetic structures due to material flaws and the like. Such sensors can also be used to install a magnetic structure within a system so as to make sure it has proper alignment, orientation, etc. Such sensors can also be used to verify that a magnetic structure produces the intended amount of flux across an interface, etc. during operation. For example, a device that uses mechanical advantage to vary a magnetic field produced by a structure can be tested within a jig having one or more Hall Effect sensors and its field characteristics can be validated to be correct or it can be determined to be not operating as desired.

FIGS. 3A and 3B depict an embodiment of a magnetic system 100 comprising one or more sensors 108 for measuring forces between first and second structural elements 104a 104b, where one of the structural elements 104a is attached to a magnetic structure 102 and the one or more sensors 108 are attached to both structural elements 104a 104b. One skilled in the art will recognize the magnetic system 100 would actually be much more complex including having one or mechanisms for providing mechanical advantage for providing the lift force indicated by the up arrow.

FIGS. 4A and 4B depict alternative embodiment for using one or more sensors 108 for measuring forces between first and second structural elements 104a 104b, where one of the structural elements 104b is attached to a magnetic structure 102 and the one or more sensors 108 are attached to both structural elements 104a 104b. One skilled in the art will recognize the magnetic system 100 would actually be much more complex including having one or mechanisms for providing mechanical advantage for providing the lift force indicated by the up arrow.

Figure 5:
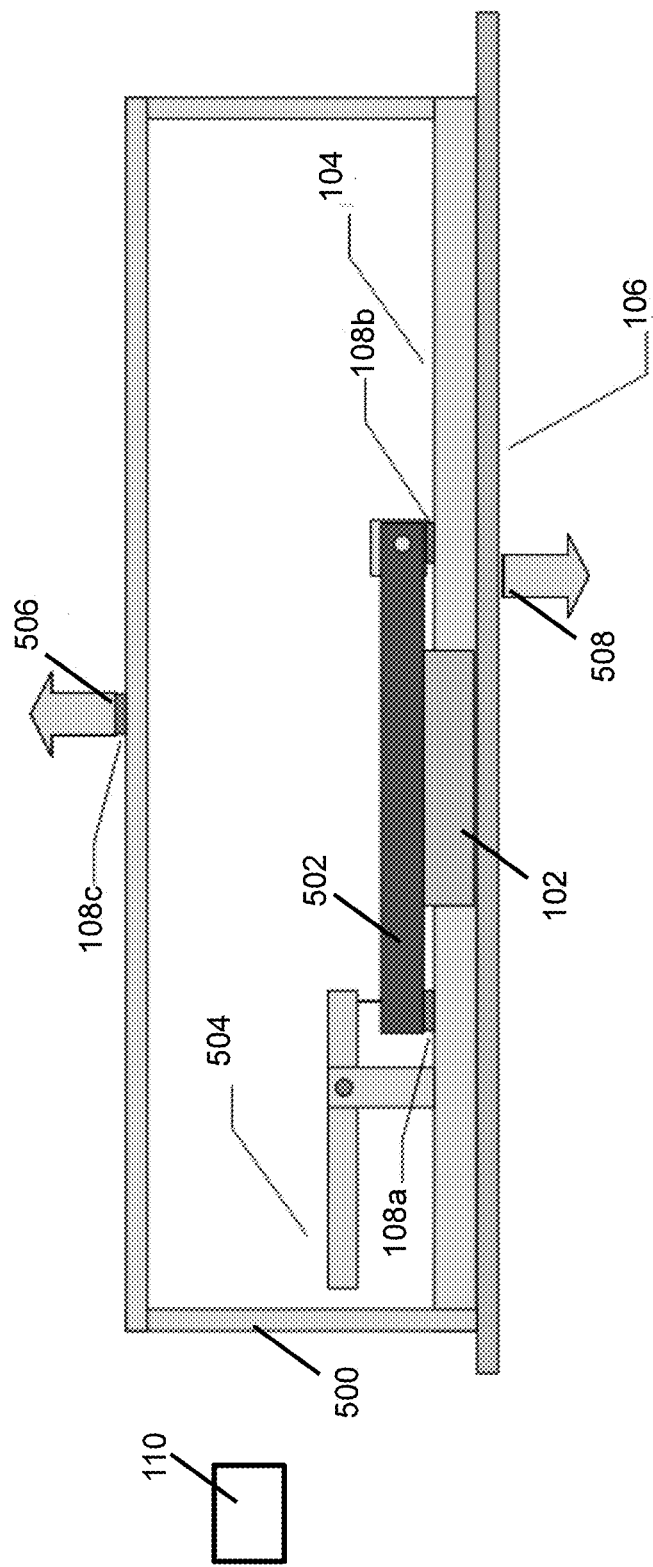
FIG. 5 depicts an exemplary metal lifting device.

FIG. 5 depicts a metal lifting device 500 similar to what was described in non-provisional application Ser. No. 13/779,611, titled "System for Detaching a Magnetic Structure from a Ferromagnetic Material", filed Feb. 27, 2013 by Fullerton et al., which was previously referenced. Metal lifting device 500 includes a magnetic structure 102 that is pivotably attached using a first lever mechanism 502 to a structural element (or base) 104, where a second lever (or removal) mechanism 504 that is attached to the first lever mechanism 502 can be moved downward to provide a mechanical advantage to lift one side of the magnetic structure 102 so as to cause a spacing between the magnetic structure 102 and a magnetically attached target 106 to as to cause detachment of the device 500 from the target 106. Referring to FIG. 5, force sensors (i.e., load cells) 108a 108b measure the magnetic force between the magnetic structure 102 and the target 106 and an additional load cell 802c measures a lift force being applied to the lifting device when lifting the target 106. In accordance with the invention, a control system 110 can monitor the sensor data to differentiate between the magnetic force and the lift force to determine whether the target 106 will detach from the device 500. A lift force 506 and gravity force 508 are indicated with up and down arrows.

One skilled in the art of force measurements will recognize that various sensor configurations are possible for measuring tensile, shear, and torque using various types of strain gages and the like. Such measurements can be made in at least one dimension with multiple degrees of freedom up to 6 DOF measurements enabling the complete force behavior of a magnetic structure to be characterized.

Generally, data from one or more sensors can be collected over the full range of a predefined movement path of a magnetic system and used to control the magnetic system while moving along the movement path and to recognize anomalies during operation of the system. Given the ability to vary forces as described herein, the control system can optimize performance of the system during operation by varying magnetic parameters based on measured sensor data. Moreover, for applications where a movement path function is not predefined, such as with a tool being used manually, forces being produced can be compared to acceptable parameters in order to provide safety warnings and to compensate for movement of the system. For example, a measured tensile force may be compared to determine if the magnetic structure is about to detach from metal. Similarly, vibration sensor measurements can, for example, measure vibration amplitude so as to determine whether a magnetic structure is likely to disengage from metal to which it is attached. Generally, multiple sensors that are tracking movement, the distance between a magnetic structure and a target, and the like can be used to produce data that can be compared to stored data as required to control and monitor a magnetic system.

Under one arrangement measure data can be in response to a known force. For example, by modulating a force applied to the magnetic system a response can be measured. For example, a force may correspond to an impulse or a force may be correspond to a sine wave sweep (Bode plot), where the force may be varied in amplitude or time. For instance, a cable associated with the system could be monitored to see if it is about to fail, where the natural frequency of the cable would increase as an applied force (or load) increases but the body resonance decreases as the load increases.

Under one arrangement, a capacitive sensor can be used to measure the separation distance between the magnetic structure and a target including metal having some substance on it such as paint or rubber (i.e., the distance to the actual metal inself). This information can be used to predict the force curve at that distance. Other forms of sensors can be used to measure a separation distance between a magnetic structure and a target including an ultrasonic sensor.

Under another arrangement, the thickness of a metal target can be determined based on a priori knowledge of the attraction force of the magnetic structure to a known target when combined with the measured separation distance.

Under one arrangement, a reference magnet can be used with an intelligent magnetic system for calibration purposes.

While particular embodiments of the invention have been described, it will be understood, however, that the invention is not limited thereto, since modifications may be made by those skilled in the art, particularly in light of the foregoing teachings.

The invention claimed is:

1. An intelligent magnetic system, comprising: a first piece of ferromagnetic material having a first side and a second side opposite said first side, said first piece of ferromagnetic material having magnetically printed field sources that extend from said first side to said second side, said magnetically printed field sources having a first multi-polarity pattern, said first side of said first piece of ferromagnetic material being magnetically attached to a second piece of ferromagnetic material;

a shunt plate disposed on said second side of said first piece of ferromagnetic material for routing magnetic flux through said first piece of ferromagnetic material from said second side to said first side of said first ferromagnetic material;

at least one simple machine for amplifying an applied force into a detachment force that creates an angled spacing between said first piece of ferromagnetic material and said second piece of ferromagnetic material;

at least one sensor for producing sensor data; and a control system for monitoring said sensor data and managing the use of the first piece of ferromagnetic material.

2. The intelligent magnetic system of claim 1, wherein said at least one sensor measures at least one of a lift force being applied to the intelligent magnetic system or the magnetic force between said first piece of ferromagnetic material and said second piece of said ferromagnetic material.

3. The intelligent magnetic system of claim 1, wherein said second piece of ferromagnetic material comprises magnetically printed field sources having a second multi-polarity pattern that is complementary to said first multi-polarity pattern.

4. The intelligent magnetic system of claim 1, further comprising: said second piece of ferromagnetic material.

5. The intelligent magnetic system of claim 1, wherein said at least one sensor measures a magnetic field.

6. The intelligent magnetic system of claim 1, wherein said at least one sensor measures a tensile force.

7. The intelligent magnetic system of claim 1, wherein said at least one sensor measures a shear force.

8. The intelligent magnetic system of claim 1, wherein said at least one sensor measures a torque.

9. The intelligent magnetic system of claim 1, wherein said at least one sensor includes at least one of a temperature sensor, a barometric sensor, an accelerometer, a capacitive sensor, an electrical sensor, an optical sensor, an ultrasonic sensor, or a vibration sensor.

10. The intelligent magnetic system of claim 1, wherein said control system characterizes said sensor data as being within an acceptable range or being outside an acceptable range.

11. The intelligent magnetic system of claim 10, wherein control system provides a warning indication when said control system characterizes said sensor data as being outside an acceptable range.

12. The intelligent magnetic system of claim 11, wherein said warning indication comprises at least one of a visual indication or an audio indication.

13. The intelligent magnetic system of claim 1, wherein said sensor data is used to control a magnetic property of said first ferromagnetic material or said second ferromagnetic material.

14. The intelligent magnetic system of claim 1, wherein said sensor data is conveyed from said at least one sensor to said control system using a wire.

15. The intelligent magnetic system of claim 1, wherein said sensor data is conveyed from said at least one sensor to said control system wirelessly.

16. The intelligent magnetic system of claim 1, wherein a property of said first ferromagnetic material or said second ferromagnetic material can be modulated to convey information to said sensor.

17. The intelligent magnetic system of claim 1, wherein said sensor data corresponds to temperature information that can be used to automatically adjust a property of said first ferromagnetic material or said second ferromagnetic material in order to compensate for temperature-related force variations.

18. The intelligent magnetic system of claim 1, wherein said at least one sensor is used to measure a separation distance between said first ferromagnetic material and said second ferromagnetic material.

19. The intelligent magnetic system of claim 1, wherein said at least one sensor is used to determine whether said intelligent magnetic system is in motion.

20. The intelligent magnetic system of claim 19, wherein said at least one sensor is used to track movement of said intelligent magnetic system.

* * * * *